United States Patent [19]

Parrillo et al.

[11] Patent Number: 4,808,543
[45] Date of Patent: Feb. 28, 1989

[54] WELL EXTENSIONS FOR TRENCH DEVICES

[75] Inventors: Louis C. Parrillo; Richard W. Mauntel, both of Austin, Tex.; John M. Barden, Albuquerque, N. Mex.

[73] Assignee: Motorola, Inc., Schaumburg, Ill.

[21] Appl. No.: 860,734

[22] Filed: May 7, 1986

[51] Int. Cl.[4] ............................................. H01L 29/92
[52] U.S. Cl. ....................................... 437/38; 437/47; 357/23.6
[58] Field of Search .......................... 437/38, 47, 52, 78; 357/23.6

[56] References Cited

U.S. PATENT DOCUMENTS

| H204 | 2/1987 | Oh et al. | 156/648 |
| 4,472,240 | 9/1984 | Kameyama | 156/648 |
| 4,631,803 | 12/1986 | Hunter et al. | 437/67 |

FOREIGN PATENT DOCUMENTS

| 0064444 | 4/1985 | Japan | 437/31 |
| 60-154664 | 8/1985 | Japan . | |
| 0152059 | 8/1985 | Japan | 357/23.6 |

Primary Examiner—Olik Chaudhuri
Attorney, Agent, or Firm—John A. Fisher

[57] ABSTRACT

A bulge well structure for trench devices in wells of a conductivity type opposite to that of the substrate where the bottom of the trench has localized, extra doping. The additional doping into the bottom of the trench prior to device formation may be implanted while the photoresist mask for the trench formation is still in place. In one embodiment of the method, the trenches and the bulge or well extension formations at their bottoms are created before isolation regions are formed. The structure and method permit increased doping only where needed and are compatible with thin epitaxial layers and sharp transition interfaces of epitaxy with substrate for optimum latchup protection. No extra masks are required and the tight packing allowed by trench technology is not altered. Protection against soft errors and junction leakage by forming DRAM trench capacitors in a well of opposite conductivity type from the substrate may be provided.

8 Claims, 3 Drawing Sheets

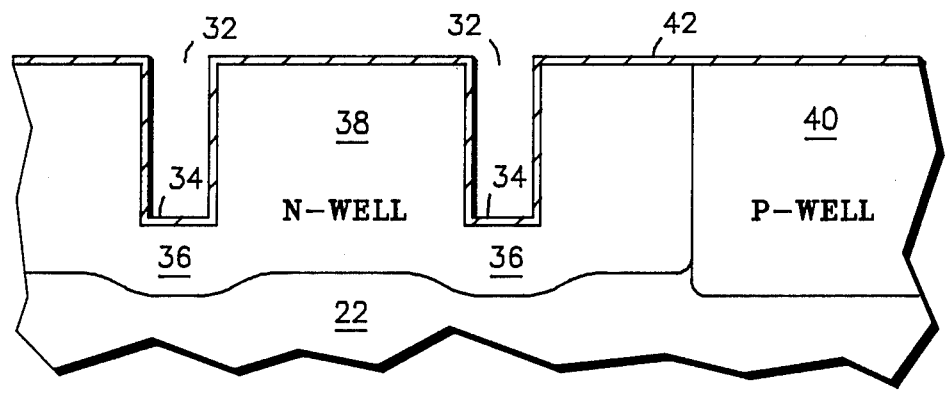
FIG. 4
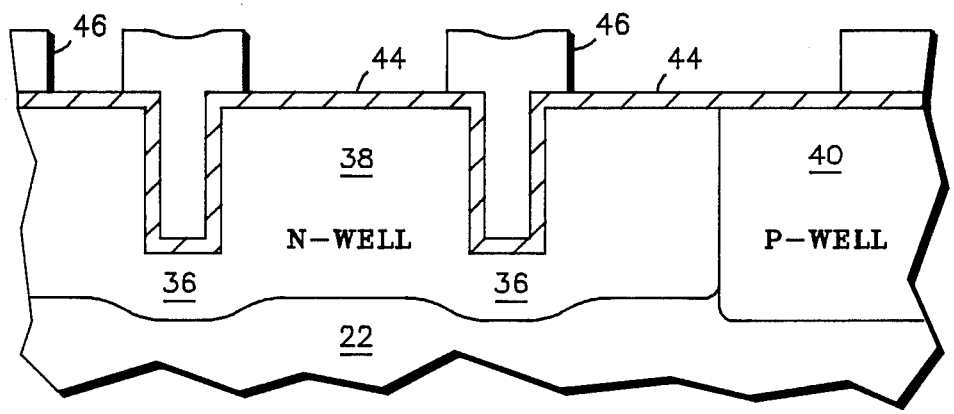
FIG. 5
FIG. 6
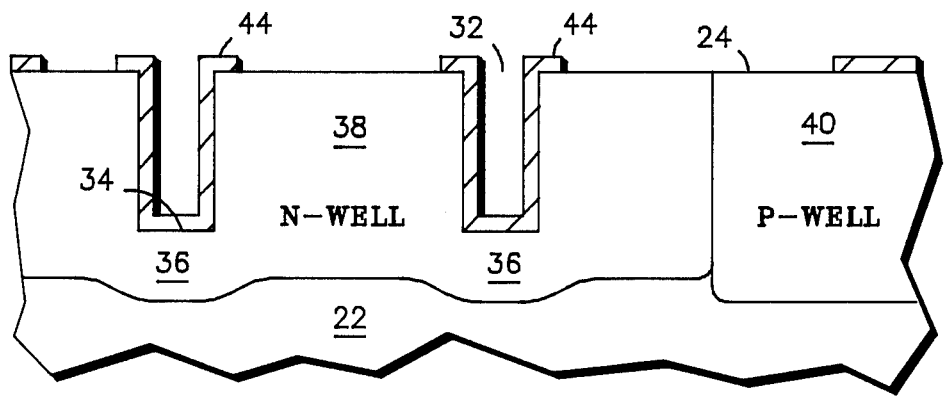

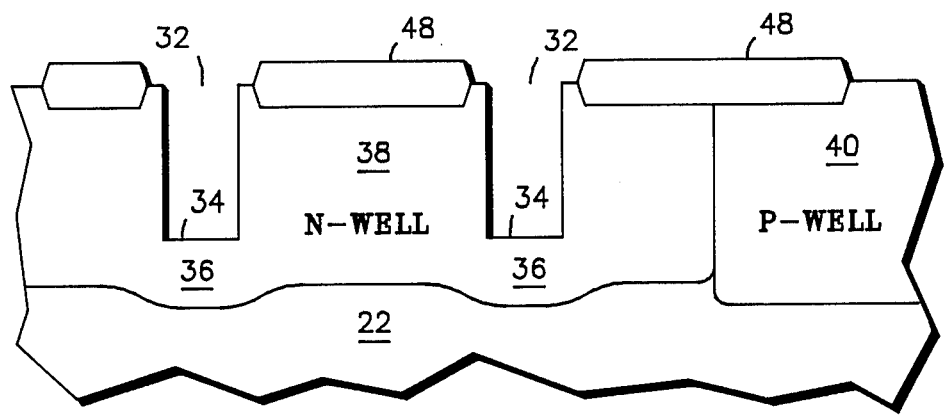
FIG. 7
FIG. 8
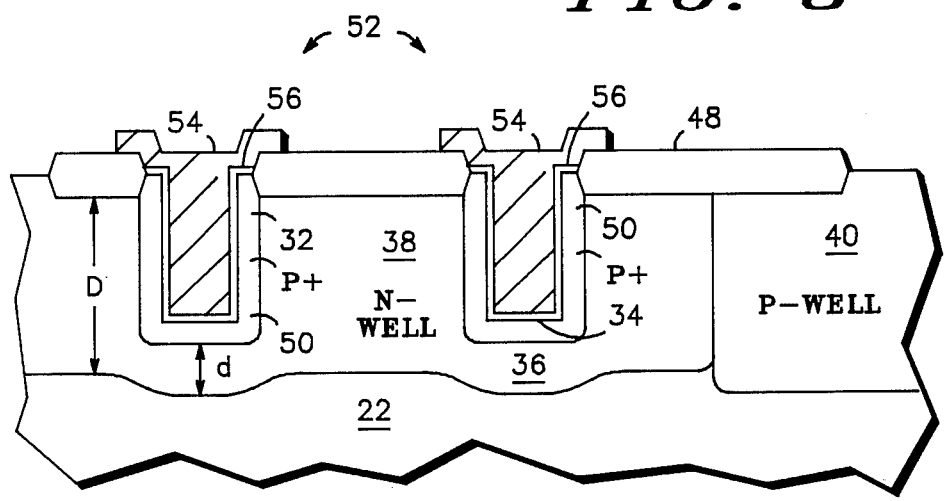

WELL EXTENSIONS FOR TRENCH DEVICES

CROSS-REFERENCE TO A RELATED APPLICATION

This application is related to U.S. Ser. No. 860,738, filed May 7, 1988, which is concerned with high capacitance trench capacitors and a well extension process therefor.

FIELD OF THE INVENTION

The invention relates to integrated circuit structures and processes for making such structures and is more particularly related to structures involving trench-type devices such as capacitors and transistors formed in well regions of the opposite conductivity type.

BACKGROUND OF THE INVENTION

To increase storage capacity in semiconductor integrated circuit dynamic random access memories (DRAMs), trench capacitors are being widely explored. Nearly all published reports have employed trenches formed in bulk or in regions doped of a given type consistent throughout the wafer. Placing a trench in a well in the opposite type of substrate produces better soft error protection and lower junction leakage (the diffusion component) because the number of minority carriers that are available to discharge the dynamic nodes are only those available within the well dimension which is small compared to the minority carrier diffusion lengths, which are relatively large.

A major problem in placing a trench in a well of the opposite type of conductivity is the fact that only a small amount of charge (due to well doping under the trench) is available to electrically isolate the trench inversion layer or capacitor electrode layer from the substrate.

As an example, consider a p-channel metal-oxide-semiconductor (PMOS) trench capacitor in an n-type well in a p-type substrate as illustrated in FIG. 1. Of course, similar arguments apply for an NMOS trench capacitor in a p-type well in an n-type substrate. In FIG. 1, structures 10 and 12, which may be polysilicon, are plates of trench capacitors having capacitor dielectric layers 11 and 13 and p+ regions 15 and 17, respectively, in n-type well 14 which is adjacent to p-type well 16 in p-type substrate 18. Depletion region 20 forms the lateral punchthrough path between p+ regions 15 and 17.

Envision the p+ regions 15 and 17 of the capacitors 10 and 12 cell potentials at $V_{DD}$ (e.g. 5 V), the n well 14 at VBB (e.g. +7.5 V) and the p substrate 18 at $V_{SS}$ (e.g. 0 V). Both the cell to well and well to substrate junctions are reverse biased. The cells 10 and 12 can punchthrough to the substrate 18 if insufficient doping exists in the well 14 below the trenches 10 and 12, that is, between the p+ cell doping region to the p substrate 18. Also, resistance below and between trench capacitors such as 10 and 12 can be very high, thus degrading performance of the circuit.

In addition, for trench capacitors that are placed close to each other, lateral punchthrough currents can exist in depletion region 20 between or below the trench capacitors 10 and 12 where the well doping is light, i.e. where cell to cell depletion regions can touch.

To avoid these problems, two approaches are available. First, a heavily doped n well can be utilized to provide sufficient doping below and between trench capacitors. This approach is not advantageous because the performance of the PMOS device in the heavily doped n well will be compromised.

Alternatively, if a moderately doped well were desired to prevent deleterious effects on PMOS performance, a very deep well is needed to produce sufficient charge below the trench capacitor and between adjacent capacitors. Such a deep well would require long thermal cycles to drive in the well impurity deeply below the trench.

However, for reasonable net charges below the cell electrode (excluding depletion regions) of about $2 \times 10^{12}$ ions/cm$^2$ and reasonable trench depths of 3 microns, for example, a moderately doped well (not lightly doped) would have to be about 8 microns deep, which is unusually deep. Some of the major disadvantages of such deep wells include large lateral diffusion, hence large separations would be required between PMOS and NMOS transistors thus reducing the compactness advantage of the trench technology, and also a thick epitaxial layer would be required to keep the heavily doped substrate from diffusing up into the epitaxial layer. Also, a large transition distance between the lightly doped epitaxial layer and the substrate boundary would be required to prevent degradation of latchup protection due to large vertical up diffusion from the substrate.

These disadvantages conflict with providing latchup immunity with epitaxy, which requires thin epitaxial layers and short transition distances, as well as soft error protection since the deeper well produces a larger volume for minority carrier generation to discharge dynamic nodes. In addition, larger volumes produce more minority carrier diffusion current, which is also deleterious to charge storage in dynamic nodes.

SUMMARY OF THE INVENTION

Accordingly, it is an object of the present invention to provide an integrated circuit having trench devices in a well of opposite conductivity from the substrate to have better soft error protection and lower junction leakage.

Another object of the present invention is to provide integrated circuit trench devices in a well of opposite conductivity from the substrate having the above advantages without requiring a heavily doped well or an extraordinarily deep well.

It is another object of the present invention to provide integrated circuit trench devices having the above noted properties by a method which does not require an extra mask step.

In carrying out these and other objects of the invention, there is provided, in one form, a semiconductor integrated circuit bulge well structure having at least one doped well region of one conductivity type formed in selected portions of a face of a semiconductor substrate. A plurality of trenches are formed within the doped well region; and at least one bulge well region of the same conductivity type as the doped well region is located at the bottom of selected ones of the trenches, extending below the bottom of the doped well region.

BRIEF DESCRIPTION OF THE DRAWINGS

FIG. 4 is a cross-section illustration of the bulge well structure after the unique well definition of this invention is complete;

FIGS. 5 through 7 are cross-section illustrations of the bulge well structure of this invention during formation of the field oxide regions between the trench devices; and FIG. 8 is a cross-section illustration of the finished bulge well structure of the present invention where the trench devices are capacitors.

DETAILED DESCRIPTION OF THE INVENTION

In general, the process of the present invention consists of (1) forming the well, or twin well, regions partially, (2) forming the trenches into the wells, (3) implanting the well type impurity into the trench bottoms and (4) diffusing the wells and the additional trench implant to the desired depth in a subsequent anneal step or thermal cycle. In this fashion, a "bulge" or region of higher impurity level is placed where necessary.

The invention will be described in more detail with reference to the Figures beginning with FIG. 2 which shows a semiconductor substrate 22 having a major flat surface or face 24 and two adjacent partially doped wells, partial n-well 26 and partial p-well 28. For the purposes of illustration, the substrate 22 may be bulk semiconductor material or may be an epitaxial layer formed by any of the well-known procedures. For the particular case that will be discussed, substrate 22 will be taken to be a p doped epitaxial layer and the trenches will be formed in the n-well 26, the well of the conductivity type opposite the epi, although the method and structures of this invention may also be applied to trench devices of a p-well in an n-doped substrate, and, of course, to wells of the same conductivity type ss the epi or substrate.

Figure 1:
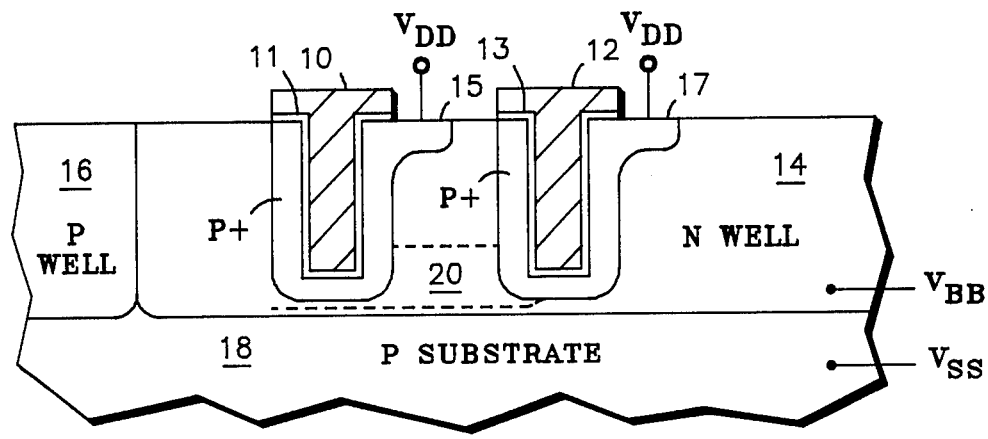
FIG. 1 is a cross-section illustration of two trench capacitors in a doped well of a prior art configuration illustrating some of the problems associated therewith.
Figure 2:
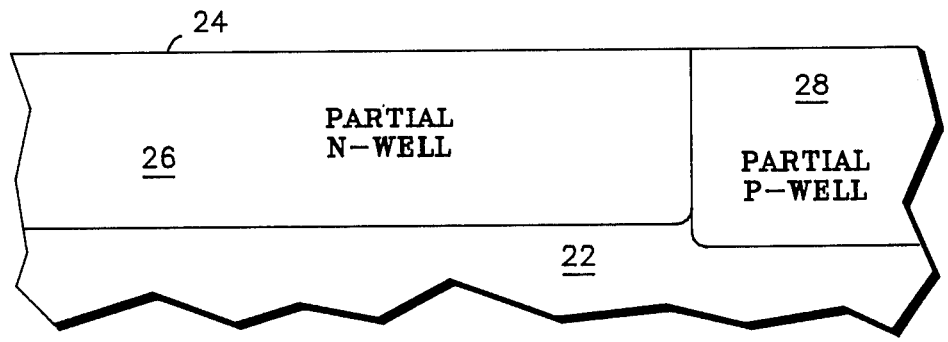
FIG. 2 is a cross-section illustration of adjacent wells of different conductivity types in an epitaxial layer.
Figure 3:
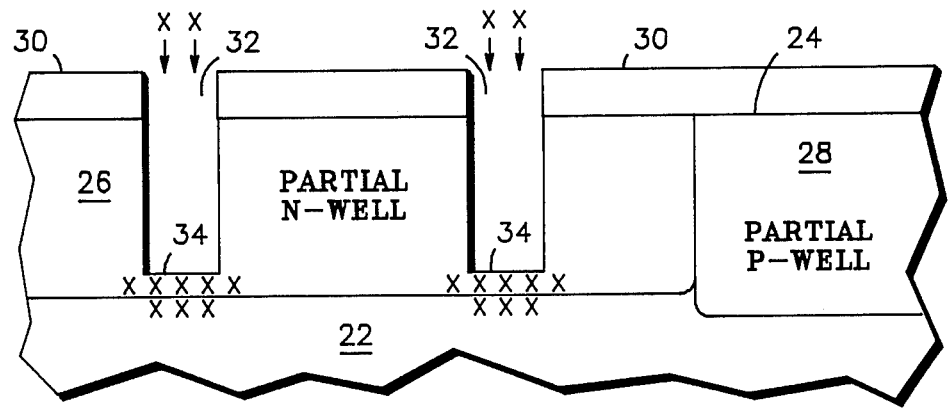
FIG. 3 is a cross-section illustration of the implantation of impurity in the bottom of trenches formed into the doped wells in accordance with the method and structure of this invention.

Shown in FIG. 3 is the structure of FIG. 2 after a masking material layer 30 is formed on the major flat surface 24. The masking material layer 30 may be photoresist which is patterned for the trench locations. The trenches 32 are typically formed by anisotropic etching, such as reactive ion etching, RIE, to the desired depth. As shown in FIG. 3, one of the unusual steps of the inventive method is an implantation step in which dopant, here an n-dopant, phosphorus, as represented by the Xs, is implanted into the bottoms 34 of the trenches only. To achieve the goal of only implanting the bottoms 34 of the trenches 32, patterned photoresist layer 30 remains in place and absorbs dopant to prevent the other portions of well regions from further doping. Implanting into trenches to provide channel stops under isolation regions is known, as seen in U.S. Pat. Nos. 4,526,631 and 4,532,696, for example, but is unknown in trenches into which active or passive devices are to be fabricated.

After the trench bottoms 34 have been adequately doped, patterned photoresist layer 30 is stripped and the implanted phosphorus atoms are driven in via a thermal step to give the result shown in FIG. 4 wherein bulges 36 at the bottom 34 of each trench 32 are formed, and completed n-well 38 and completed p-well 40 are created in their final desired state. The bulges 36 provide the necessary increased dopant level region to an extra depth without affecting the rest of the doped n-well region 26 and without an extra mask. During the thermal drive-in step, a thin layer of oxide 42 may be formed.

Next, it is advised to form isolation oxidation regions. Note that this sequence is the reverse of the typical trench formation procedure wherein the isolation regions are formed before the trenches are fabricated. Of course, it is anticipated that the present bulge or extension well process could be easily integrated into a process using trench isolation techniques. First, a blanket layer 44 of isolation masking material is created over the entire surface of the wafer, where the isolation masking material layer 44 may be silicon nitride, a silicon oxide/silicon nitride/silicon oxide (ONO) sandwich or the like. Layer 44 is next covered with photoresist layer 46 which is patterned to expose the future isolation regions to give the resultant structure shown in FIG. 5.

The isolation masking material layer 44 is next selectively etched to give the structure seen in FIG. 6. As shown in FIG. 7, the subsequent step is to grow or otherwise form field oxide isolation regions 48 by techniques well known to those skilled in the art. Isolation masking material layer 44 is next stripped off.

Subsequently, doped semiconductor regions 50 are formed on the sides and bottoms 34 of trenches 32 to provide pn junctions for the trench devices, which in the case illustrated in FIG. 8 are trench capacitors 52 being filled with polysilicon plates 54, after thin capacitor dielectric layers 56 are formed. It is anticipated that the method and bulge well structure of this invention would perform well with other device structures, such as active and passive devices in the trenches, particularly the various trench transistor structures that have been proposed.

The structure and method of the present invention extends the well doping level only where needed vertically and laterally in the vicinity of the trench, particularly the bottom of the trench, as seen in FIG. 8. The trench devices are not limited by the depth of the well, D, but are shielded from the substrate by the extended or bulged doped well layer of thickness d. Thus, a relatively shallow and lightly doped well process that produces high performance PMOS devices can be used to accommodate trench capacitors while still having compatibility with thin epitaxial layers, sharp transition regions of epitaxy to substrate and electrically small volume of minority carriers, since the relatively heavier doped bulge regions have few minority carriers for leakage. Further, the increased doping in the well extensions or bulges allows tighter packing of trenches, due to the fact that lateral isolation is not increased. In addition, the relatively heavily doped portion of the bulge region acts to produce higher capacitance of the cell implant to well and a reflecting barrier to minority carriers entering the high capacitance junction area. Note also that this well formation process is compatible with shallow well SRAMs, MPUs and other applications. Of course, the same advantages would be present for NMOS devices in an opposite array type.

We claim:

1. A method for making a semiconductor integrated circuit in a semiconductor substrate comprising the steps of:

forming at least one doped well region of one conductivity type in the face of the semiconductor substrate, the doped well region having a bottom;

forming a plurality of trenches in the doped well region using a masking pattern, each trench having a bottom; and forming at least one impurity region of the same conductivity type as the doped well region, the impurity region located at the bottom of the trenches, and extending below the bottom of the doped well region; comprising the steps of:

first, distributing an impurity of the same conductivity type as the doped well region solely into the bottom of the trenches using the same masking pattern used to form the trenches; and second, driving in the impurity to form a concentration of impurity around the bottom of each of the trenches so that the resultant impurity regions expand the bottom of the doped well regions.

2. The method for making a semiconductor integrated circuit of claim 1 in which isolation regions are subsequently formed after the formation of the impurity region.

3. The method for making a semiconductor integrated circuit of claim 2 in which passive or active devices are formed within the trenches after the formation of the isolation regions.

4. The method of claim 1 in which the impurity of the same conductivity type as the doped well region is distributed by ion implantation into the bottom of the trench.

5. A method for making a semiconductor integrated circuit in a semiconductor substrate comprising the steps of:

forming at least one doped well region of a conductivity type which is the opposite conductivity type as that of the semiconductor substrate, in a face of the semiconductor substrate, the doped well region having a bottom;

forming a plurality of trenches within the doped well region substantially perpendicular to the substrate face using a masking pattern, each trench having a bottom;

forming at least one impurity region of the same conductivity type as the doped well region, the impurity region located at the bottom of the trenches, and extending below the bottom of the doped well region; comprising the steps of:

first, distributing an impurity of the same conductivity type as the doped well region solely into the bottom of the trenches using the same masking pattern used to form the trenches; and second, driving in the impurity to form a concentration of impurity around the bottom of each of the trenches so that the resultant impurity regions expand the bottom of the doped well regions; and forming at least one isolation region.

6. The method of claim 5 in which the impurity of the same conductivity type as the doped well region is distributed by ion implantation into the bottom of the trench.

7. A method for making a semiconductor integrated circuit bulge well structure in a semiconductor substrate comprising the steps of:

forming an epitaxial layer of one conductivity type upon a face of the semiconductor substrate;

forming at least one doped well region of the opposite conductivity type as that of the epitaxial layer, in the epitaxial layer, the doped well region having a bottom;

forming a plurality of trenches within the doped well region substantially perpendicular to the substrate face using a masking pattern, each trench having a bottom;

forming at least one impurity region of the same conductivity type as the doped well region, the impurity region located at the bottom of the trenches, and extending below the bottom of the doped well region, comprising the steps of:

first, distributing an impurity of the same conductivity type as the doped well region solely into the bottom of the trenches using the same masking pattern used to form the trenches; and second, driving in the impurity to form a concentration of impurity around the bottom of each of the trenches so that the resultant impurity regions expand the bottom of the doped well regions; and forming an isolation region.

8. The method of claim 7 in which the impurity of the same conductivity type as the doped well region is distributed by ion implantation into the bottom of the trench.

* * * * *